United States Patent
Huang et al.

(10) Patent No.: US 12,120,822 B2
(45) Date of Patent: Oct. 15, 2024

(54) POWER MODULE WITH OUTPUT INDUCTORS AND OUTPUT CAPACITORS THAT ARE EMBEDDED WITHIN SUBSTRATE LAYERS

(71) Applicant: MONOLITHIC POWER SYSTEMS, INC., San Jose, CA (US)

(72) Inventors: Daocheng Huang, Santa Clara, CA (US); Xinmin Zhang, San Jose, CA (US); Yishi Su, San Jose, CA (US); Yingxin Zhou, San Jose, CA (US); Wenyang Huang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 228 days.

(21) Appl. No.: 17/870,555

(22) Filed: Jul. 21, 2022

(65) Prior Publication Data

US 2023/0269877 A1    Aug. 24, 2023

Related U.S. Application Data

(63) Continuation-in-part of application No. 17/678,172, filed on Feb. 23, 2022.

(51) Int. Cl.
*H05K 1/18* (2006.01)
*H02M 3/158* (2006.01)

(52) U.S. Cl.
CPC ............ *H05K 1/185* (2013.01); *H05K 1/181* (2013.01); *H02M 3/158* (2013.01); *H05K 2201/10053* (2013.01); *H05K 2201/10378* (2013.01)

(58) Field of Classification Search
CPC ....... H02M 3/158; H05K 1/185; H05K 1/181; H05K 2201/10053; H05K 2201/10378
See application file for complete search history.

(56) References Cited

U.S. PATENT DOCUMENTS

2019/0109538 A1* 4/2019 Zhou .................. H05K 1/181

OTHER PUBLICATIONS

"MP86976—Intelli-PhaseTM Solution (Integrated HS/LS FETs and Driver) in 3×6mm TLGA", MP86976 Rev0.1, www.MonolithicPower.com, dated Jan. 23, 2019.

* cited by examiner

*Primary Examiner* — Rafael O De Leon Domenech
(74) *Attorney, Agent, or Firm* — Beyer Law Group LLP

(57) ABSTRACT

A power module has a printed circuit board (PCB) having an output inductor substrate layer and an output capacitor substrate layer. Power converters of the power module are implemented using monolithic integrated circuit (IC) switch blocks that are mounted on a surface of the power module. Output voltages of the power converters are provided at output voltage nodes. The power converters include output inductors that are embedded within the output inductor substrate layer and output capacitors that are embedded within the output capacitor substrate layer. Embedded output inductors and capacitors are connected to corresponding output voltage nodes.

18 Claims, 7 Drawing Sheets

POWER MODULE WITH OUTPUT INDUCTORS AND OUTPUT CAPACITORS THAT ARE EMBEDDED WITHIN SUBSTRATE LAYERS

CROSS-REFERENCE TO RELATED APPLICATION

The present application is a continuation-in-part of U.S. application Ser. No. 17/678,172, filed on Feb. 23, 2022, which is incorporated herein by reference in its entirety.

TECHNICAL FIELD

The present invention is directed to electrical circuits, and more particularly but not exclusively to power modules.

BACKGROUND

A power module comprises power converters that are implemented on a substrate, such as a printed circuit board (PCB). Power modules may be employed to provide one or more supply voltages to various electrical devices. A power module may provide two or more output phases by incorporating a corresponding number of power converters, with each power converter providing a phase of the output. Embodiments of the present invention pertain to power modules with a low profile, allowing them to be used in automotive, computer server, and other applications where space is a premium.

BRIEF SUMMARY

In one embodiment, a power module includes a printed circuit board (PCB) comprising an output capacitor substrate layer and an output inductor substrate layer. A first monolithic integrated circuit (IC) switch block is mounted on a top surface of the output inductor substrate layer, the first monolithic IC switch block including a first pair of switches. A second monolithic IC switch block is mounted on the top surface of the output inductor substrate layer, the second monolithic IC switch block including a second pair of switches. A first output inductor is embedded within the output inductor substrate layer, the first output inductor having a first end that is connected to a switch node formed by the first pair of switches and a second end that is connected to a first output voltage node. A second output inductor is embedded within the output inductor substrate layer, the second output inductor having a first end that is connected to a switch node formed by the second pair of switches and a second end that is connected to a second output voltage node. A first output capacitor is embedded within the output capacitor substrate layer, the first output capacitor having a first end that is connected to the first output voltage node and a second end that is connected to power ground. A second output capacitor is embedded within the output capacitor substrate layer, the second output capacitor having a first end that is connected to the second output voltage node and a second end that is connected to power ground.

In another embodiment, a power module includes a printed circuit board (PCB) comprising an output capacitor substrate layer and an output inductor substrate layer. A first power converter generates a first output voltage at a first output voltage node, one or more components of the first power converter being mounted on a top surface of the PCB. A first output inductor is embedded within the output inductor substrate layer, the first output inductor being connected to the first output voltage node. A first output capacitor is embedded within the output capacitor substrate layer, the first output capacitor being connected to the first output voltage node.

In yet another embodiment, a power module includes a printed circuit board (PCB) comprising an output capacitor substrate layer and an output inductor substrate layer. A first monolithic integrated circuit (IC) switch block is mounted on a top surface of the output inductor substrate layer, the first monolithic IC switch block comprising a switch that is connected to a first output voltage node. A second monolithic IC switch block is mounted on the top surface of the output inductor substrate layer, the second monolithic IC switch block comprising a switch that is connected to a second output voltage node. A first output inductor is embedded within the output inductor substrate layer, the switch of the first monolithic IC switch block being connected to the first output voltage node by way of the first output inductor. A second output inductor is embedded within the output inductor substrate layer, the switch of the second monolithic IC switch block being connected to the second output voltage node by way of the second output inductor. A first plurality of discrete capacitors that are connected in parallel is embedded within the output capacitor substrate layer, the first plurality of discrete capacitors being connected between the first output voltage node and power ground. A second plurality of discrete capacitors that are connected in parallel is embedded within the output capacitor substrate layer, the second plurality of discrete capacitors being connected between the second output voltage node and power ground.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not necessarily drawn to scale.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
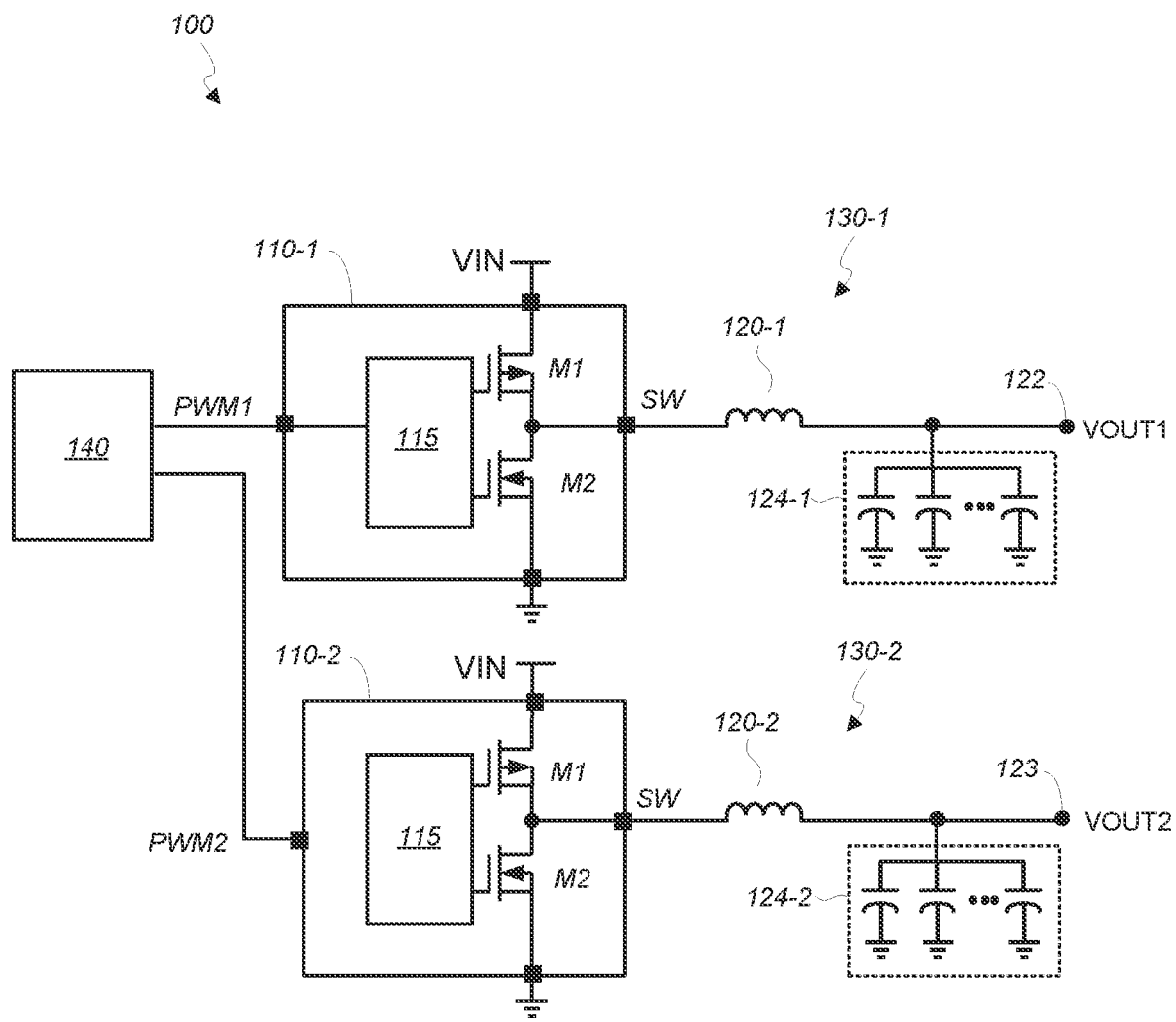
FIG. 1 shows a schematic diagram of a power module in accordance with an embodiment of the present invention.

FIG. 1 shows a schematic diagram of a power module 100 in accordance with an embodiment of the present invention. In the example of FIG. 1, the power module 100 has two power converters 130 (i.e., 130-1, 130-2), with each power converter 130 comprising an output inductor 120 (i.e., 120-1, 120-2), an output capacitor 124 (i.e., 124-1, 124-2), and a monolithic integrated circuit (IC) switch block 110 (i.e., 110-1, 110-2). In one embodiment, an output capacitor 124 comprises a plurality of discrete capacitors that are connected in parallel. In the example of FIG. 1, a power converter 130 is a buck converter. As can be appreciated, a power converter 130 may also be configured as a boost converter or other type of power converter depending on the application.

Each of the power converters 130-1 and 130-2 receives an input voltage VIN to generate an output voltage VOUT (i.e., VOUT1, VOUT2). The output voltages of the power converters 130-1 and 130-2 may be connected together and interleaved to generate a multiphase output voltage. For example, an output voltage node 122 and an output voltage node 123 may be connected together, with each power converter 130 providing a phase of a multiphase output voltage. In that example, the power module 100 may include additional power converters to add more phases.

An output capacitor 124 is connected to each output voltage node. In the example of FIG. 1, an output capacitor 124-1 has a first end that is connected to the output voltage node 122 and a second end that is connected to power ground. Similarly, an output capacitor 124-2 has a first end that is connected to the output voltage node 123 and a second end that is connected to power ground. Other capacitors (e.g., input capacitors, supply capacitors) and other components not necessary to the understanding of the invention are not shown in FIG. 1 for clarity of illustration.

In one embodiment, a switch block 110 is implemented using an MP86976 Intelli-Phase™ Solution monolithic IC, which is commercially-available from Monolithic Power Systems, Inc. Other suitable monolithic IC's may also be used without detracting from the merits of the present invention. A switch block 110 has, integrated therein, a driver 115 and a pair of switches M1, M2 (e.g., Metal-Oxide-Semiconductor Field-Effect Transistor (MOSFET)). Other circuits for implementing the driver 115, such as an auxiliary 3.3V power supply circuit, are not shown for clarity of illustration. As shown in FIG. 1, a switch block 110 has a first pin for receiving a pulse width modulation (PWM) signal, a second pin for receiving an input voltage VIN, a third pin for connecting to power ground, and a fourth pin that is connected to a switch node SW formed by the switches M1, M2. The drain of the switch M1 is connected to the input voltage VIN and the source of the switch M2 is connected to power ground. The source of the switch M1 is connected to the drain of the switch M2 at the switch node SW.

Generally speaking, PWM control is well-known in the art. Briefly, an external PWM controller 140 generates a PWM signal, which is received by a driver 115 at the first pin of the switch block 110. The driver 115 turns the switches M1, M2 ON and OFF in accordance with the PWM signal. Turning the switch M1 ON while turning the switch M2 OFF connects the input voltage VIN to the switch node SW (by way of the switch M1), whereas turning the switch M1 OFF while turning the switch M2 ON connects the switch node SW to power ground (by way of the switch M2). A first end of an output inductor 120 is connected to the switch node SW and a second end of the output inductor 120 is connected to an output voltage node (i.e., 122, 123) where an output voltage VOUT is developed. In the example of FIG. 1, the PWM controller 140 generates the PWM signals PWM1, PWM2 such that a corresponding output voltage VOUT is maintained in regulation. Other circuits for implementing the PWM control, such as sense circuits, are not shown for clarity of illustration.

The input voltage VIN, output voltage VOUT, and switching frequency of the switches M1, M2 depend on the particulars of the monolithic IC switch block 110. In one embodiment where the monolithic IC switch block 110 is implemented using the aforementioned MP86976 Intelli-Phase™ Solution monolithic IC, the input voltage VIN is in the range of 3V to 7V, the output voltage VOUT is in the range of 0.4V to 2V (e.g., 0.8V), and the switching frequency of the switches M1, M2 is in the range of 1 MHz to 2 MHz (e.g., 1.5 MHz). The relatively low input voltage VIN and relatively high switching frequency of the switches M1, M2 allow for a relatively small physical size of the output inductor 120 (e.g., 2.5 mm×5 mm×1.2 mm). As will be more apparent below, the output inductor 120 may be embedded within the substrate of the power module 100 to achieve a low profile.

Figure 2:
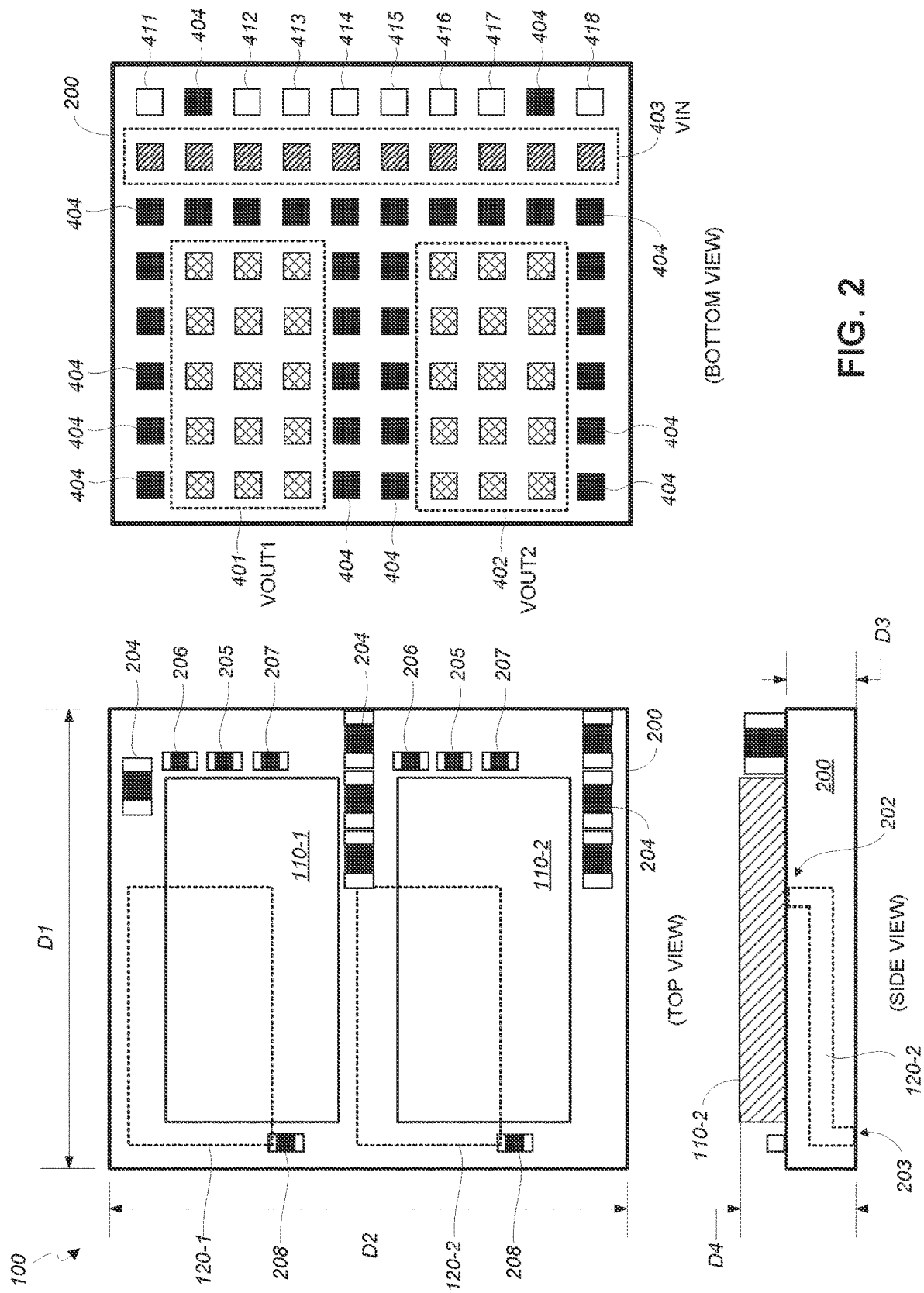
FIG. 2 shows a top view, a bottom view, and a side view of a physical layout of the power module of FIG. 1 in accordance with an embodiment of the present invention.

FIG. 2 shows, from the upper left hand corner in clockwise direction, a top view, a bottom view, and a side view of a physical layout of the power module 100 in accordance with an embodiment of the present invention. The power module 100 has a substrate 200, which in one embodiment is that of a printed circuit board (PCB). The top view of the substrate 200 shows the "component side" of the substrate 200, whereas the bottom view shows the bottom side of the substrate 200. In the example of FIG. 2, the switch blocks 110, capacitors, and other components are mounted on the component side. In other embodiments, as will be later explained beginning with FIG. 4, output capacitors are disposed within a separate output capacitor substrate layer.

In the example of FIG. 2, the bottom side, which is opposite the component side, has a plurality of pins that connect nodes of the power module 100 to components that are external to the power module 100, such as a PWM controller, etc. A pin may be a pad or other means for electrically connecting nodes and components. A pin may have a square (e.g., as in a land grid array), round (e.g., as in a ball grid array), or other shape. The power module 100 may be employed as part of a power supply (not shown). The pins of the power module 100 may be connected to corresponding sockets on a substrate of the power supply.

The top view of the power module 100 shows the switch block 110-1, switch block 110-2, and various capacitors mounted on the component side, such as input capacitors (e.g., see 204), capacitors of RC filters of supply voltages for internal digital logic control (e.g., 205, 207), bootstrap capacitors (e.g., see 206), filter capacitors of supply voltages for switch drivers (e.g., see 208), etc. As can be appreciated, the number and type of capacitors on the power module 100 depend on the particulars of the application. Generally, the capacitors on the power module 100 have relatively low capacitance. In the example of FIG. 2, a switch block 110 is the tallest component on the substrate 200. In one embodiment, the substrate 200 has a width D1 of about 8 mm; a length D2 of about 9 mm, and a substrate thickness D3 of about 1.5 mm. In one embodiment, a height D4 from the bottom surface of the substrate 200 to the topmost surface of a switch block 110 is 2.3 mm.

The output inductors 120-1 and 120-2, which are represented by dotted lines in FIG. 2, are embedded within the substrate 200. A first end of an output inductor 120 (see 202) is connected to a switch node of a corresponding switch block 110, and a second end of the output inductor 120 (see 203) is connected to a corresponding output voltage node. The relatively low inductance of each of the output inductors 120-1 and 120-2 in conjunction with the layout of the power module 100 allow the output inductors 120-1 and 120-2 to be embedded within the substrate 200, thereby lowering the profile of the power module 100. In one embodiment, the height D4 of the power module 100 is 2.3 mm and at most 5 mm.

In the example of FIG. 2, each pin of the power module 100 has a square shape, e.g., 0.45 mm×0.45 mm square. The pins that are connected to power ground, some of which are labeled as "404", are depicted in black. Not all of the ground pins are labeled for clarity of illustration. The pins that are connected to the output voltage node 122 (shown in FIG. 1), where the output voltage VOUT1 is developed, are collectively labeled as "401"; the pins that are connected to the output voltage node 123 (shown in FIG. 1), where the output voltage VOUT2 is developed, are collectively labeled as "402"; and the pins that are connected to receive the input voltage VIN are collectively labeled as "403". Pin 411 is connected to receive a PWM signal to the switch block 110-1; pin 418 is connected to receive a PWM signal to the switch block 110-2; pin 412 is connected to provide a current monitor signal from the switch block 110-1; pin 417 is connected to provide a current monitor signal from the switch block 110-2; pin 413 is connected to provide a temperature monitoring signal from the switch block 110-1; pin 416 is connected to provide a temperature monitoring signal from the switch block 110-2; pin 414 is connected to receive a VCC supply voltage; and pin 415 is connected to receive an enable signal. As can be appreciated, the pinout of the power module 100 depends on implementation details, such as the particular switch block 110 employed. The arrangement of the pins on the bottom surface of the substrate 200 may vary to suit particular applications.

Figure 3:
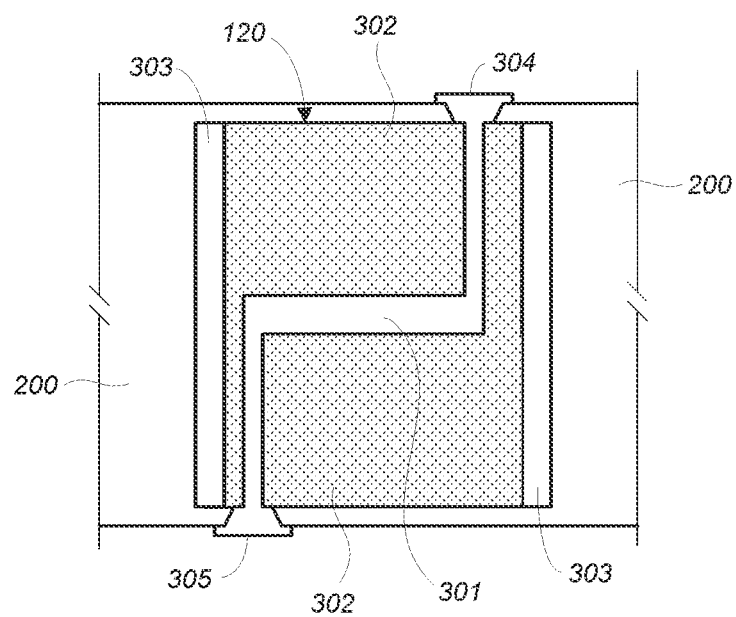
FIG. 3 shows a cross-sectional view of a substrate of the power module of FIG. 2 in accordance with an embodiment of the present invention.

FIG. 3 shows a cross-sectional view of the substrate 200 in accordance with an embodiment of the present invention. FIG. 3 provides a schematic illustration of an output inductor 120 and is not to scale. In one embodiment, the output inductor 120 is a one turn inductor. The output inductor 120 may also have a few number of turns. The output inductor 120 comprises a conductor 301 and a magnetic core 302 that surrounds the conductor 301. In one embodiment, the conductor 301 comprises copper and the magnetic core 302 comprises a suitable core material, such as ferrite or powder iron. A gap 303 is between the magnetic core 302 and the substrate material, which in one embodiment comprises a PCB substrate. Generally speaking, a PCB is a laminated sandwich structure of conductive layers (e.g., copper) and insulating/dielectric layers (e.g., fiberglass epoxy laminate). The gap 303 may be an air gap that is filled with epoxy molding compound. A first end of the conductor 301 (see 304) comes out of the component side of the substrate 200 to connect to the switch node of a corresponding switch block 110, and a second end of the conductor 301 (see 305) comes out of the bottom side of the substrate 200 to a pin that is connected to a corresponding output voltage node.

In one embodiment, the output inductor 120 has an inductance less than 100 nH. As can be appreciated, the inductance of the output inductor 120 may vary depending on the volume of the substrate 200. Larger substrates allow physically larger inductors to be embedded. For example, with a thickness D3 (shown in FIG. 2) of 1.5 mm, the output inductor 120 may have dimensions of 2.5 mm×5 mm×1.2 mm with an inductance of about 30 nH.

Figure 4:
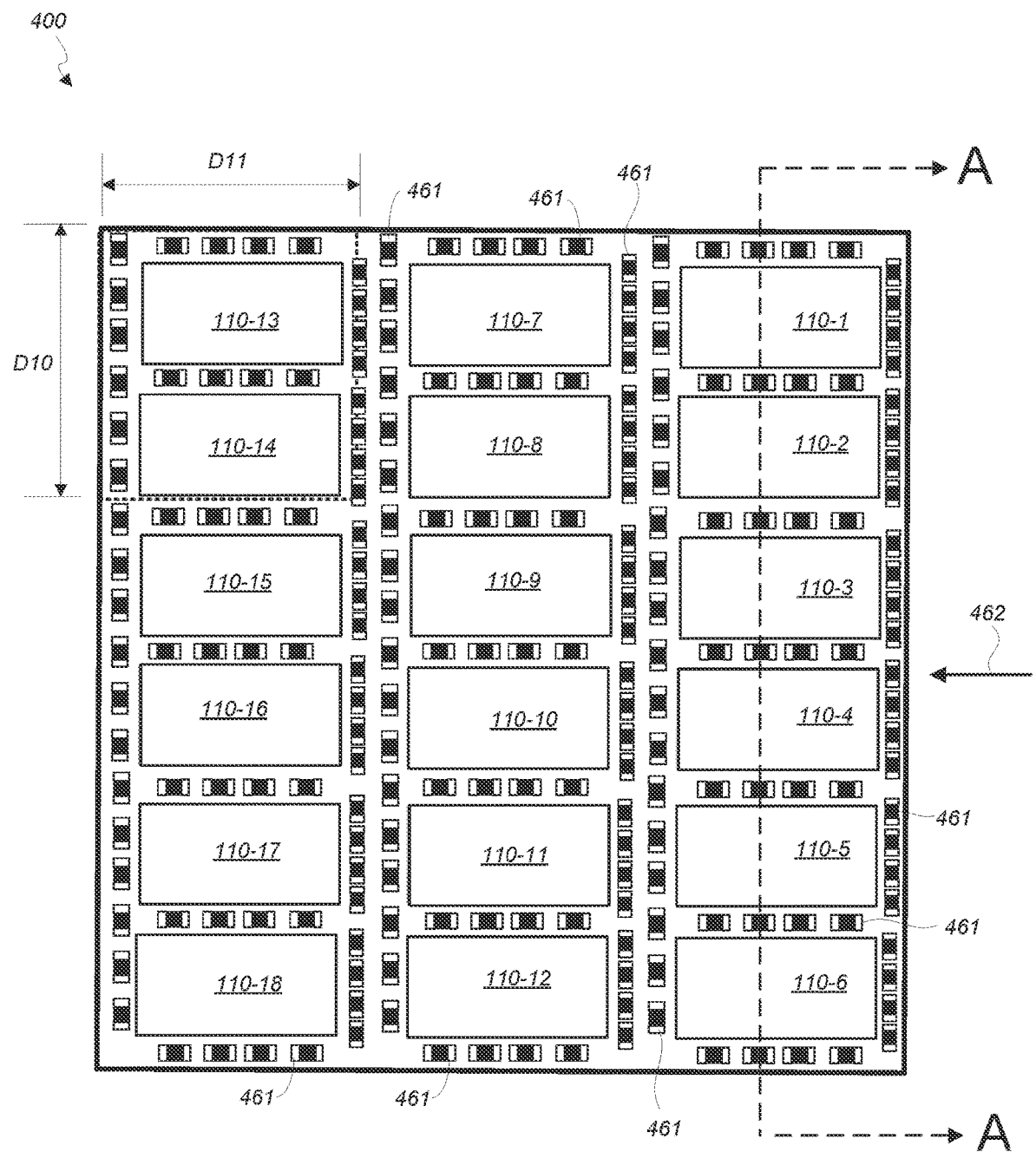
FIG. 4 shows a top view of a physical layout of a power module in accordance with an embodiment of the present invention.

FIG. 4 shows a top view of a physical layout of the power module 400 in accordance with an embodiment of the present invention. The top view of FIG. 4 shows a topmost surface of the PCB of the power module 400 where switch blocks 110 (i.e., 110-1, 110-2, . . . , 110-18), capacitors 461 (e.g., input capacitors, bootstrap capacitors, filter capacitors, supply capacitors, etc.), and other components (not shown) of the power module 400 are mounted. Each of the switch blocks 110 of the power module 400 may be employed in a power converter 130 as described in connection with FIG. 1. Generally speaking, the number of power converters on a power module, and thus the number of switch blocks, depend on the particulars of the application.

In the example of FIG. 4, the switch blocks 110 are physically arranged in groups of two (e.g., switch blocks 110-1 and 110-2 as one group; switch blocks 110-13 and 110-14 as another group; etc.), with each group of switch blocks having a length D10 of 8 mm and a width D11 of 8 mm. The switch blocks 110 may be configured to generate one or more output voltages. For example, the output voltage node of the switch block 110-1 may provide a first output voltage, and the output voltage node of the switch block 110-2 may provide a second output voltage, with each of the first and second output voltages being independent, separate output voltages. As another example, the output voltage nodes of the switch blocks 110-1 to 110-12 may be tied together to provide a first multiphase output voltage, and the output voltage nodes of the switch blocks 110-13 to 110-18 may be tied together to provide a second multiphase output voltage. All of the output voltages of the switch blocks 110 may also be tied together to generate a single multi-phase output voltage.

The power module 400 has 18 switch blocks 110 for illustration purposes only. As can be appreciated, fewer or more switch blocks 110 may be employed depending on the number of power converters provided by the power module 400. The specific layout of the components of the power module 400 may be configured to suit application details.

The power module 400 may be employed in various applications including graphics processing unit (GPU), central processing unit (CPU), application-specific integrated circuit (ASIC), etc. applications. During fast load transients, a sufficient number of output capacitors is required to limit output voltage undershoot and overshoot. However, output capacitors consume a lot of board space and decrease circuit density. This problem is especially troublesome in applications with a fixed board form factor, where the board space required by the output capacitors reduces the number of power converters available on the power module, thereby limiting the power that can be delivered to GPUs, CPUs, etc. In embodiments of the present invention, to conserve board space, an output capacitor of a power converter 130 is implemented by a plurality of parallel-connected discrete capacitors embedded within an output capacitor substrate layer of the PCB instead of on a topmost surface of the PCB.

Figure 5:
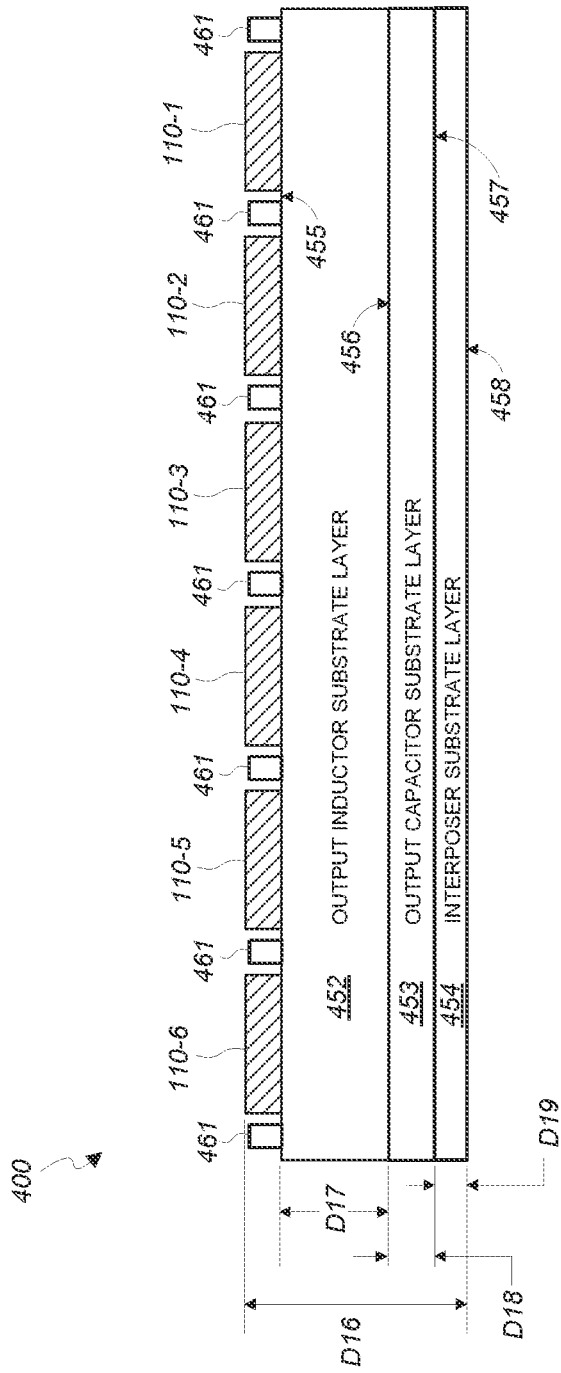
FIG. 5 shows a side view of the power module of FIG. 4 in accordance with an embodiment of the present invention.

FIG. 5 shows a side view of the power module 400, as viewed in the direction of arrow 462 of FIG. 4. The power module 400 is implemented using a PCB comprising a plurality of substrate layers, namely an output inductor substrate layer 452, an output capacitor substrate layer 453, and an interposer substrate layer 454. Advantageously, the output inductor substrate layer 452 is between the switch blocks 110 and the output capacitor substrate layer 453 to allow a terminal of an output inductor to be efficiently connected to a switch node of a switch block 110.

In the example of FIG. 5, a top surface 455 of the output inductor substrate layer 452 serves as a topmost surface of the PCB on which the switch blocks 110, capacitors 461, and other components of the power module 400 are mounted. A bottom surface 458 of the interposer substrate layer 454 serves as the bottommost surface of the PCB on which pins of the power module 400 are exposed for external connection (e.g., as in the bottom view of FIG. 2). For example, the output voltage nodes 122 and 123 (shown in FIG. 1) may be connected to corresponding pins on the bottom surface 458 of the interposer substrate layer 454. A pin may have a square (e.g., as in a land grid array), round (e.g., as in a ball grid array), or other shape. As can be appreciated, the pinout of the power module 400 depends on implementation details, such as the particular switch blocks 110 employed. The arrangement of the pins on the bottom surface 458 may vary to suit particular applications.

In the example of FIG. 5, the output inductor substrate layer 452 has a bottom surface 456 that directly contacts a top surface of the output capacitor substrate layer 453. The interposer substrate layer 454 has a top surface 457 that directly contacts a bottom surface of the output capacitor substrate layer 453. In one embodiment, the output inductor substrate layer 452 has a thickness D17 of 2.32 mm, the output capacitor substrate layer 453 has a thickness D18 of 0.5 mm, and the interposer substrate layer 454 has a thickness D19 of 0.4 mm. The power module 400 has an overall height D16 of 4 mm measured from the bottom surface 458 of the interposer substrate layer 454 to a topmost surface of a tallest component mounted on the power module 400, which in one embodiment is a switch block 110. The power module 400 may have an overall height of at most 8 mm.

The output inductor substrate layer 452 provides a substrate where the output inductors 120 (shown in FIG. 1) may be embedded within. The output inductors 120 may be embedded within the output inductor substrate layer 452 as explained with reference to FIGS. 2 and 3 except that an end of an output inductor 120 that extends out of the bottom surface now extends to the top surface of the output capacitor substrate layer 453. Electrical connections between and through the substrate layers 452-454 may be made by way of vias and/or nodes in the substrate layers 452-454.

Figure 6:
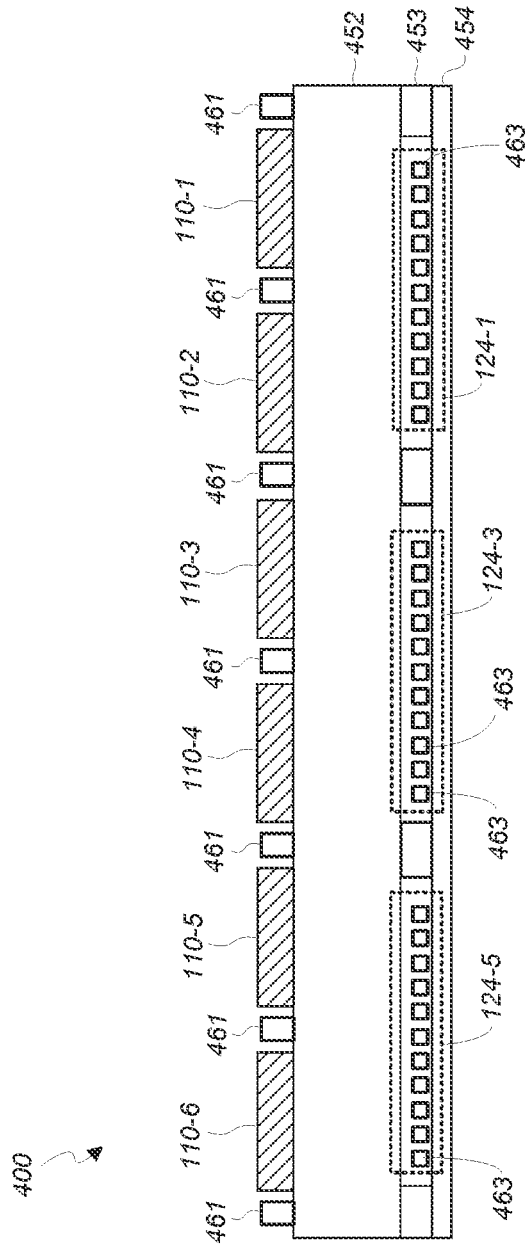
FIG. 6 shows a cross-sectional view of the power module of FIG. 4 in accordance with an embodiment of the present invention.

FIG. 6 shows a cross-sectional view of the power module 400 in accordance with an embodiment of the present invention. FIG. 6 is taken at cross-section A-A of FIG. 4. In one embodiment, an output capacitor 124 is implemented by a plurality of discrete (i.e., single, individual component; not part of an integrated circuit), embedded capacitors 463 that are connected in parallel and embedded within the output capacitor substrate layer 453. Note that not all of the embedded capacitors 463 are labeled in FIG. 6 for clarity of illustration. In one embodiment, an embedded capacitor 463 is a size 0201 capacitor. Other discrete capacitor sizes, such as size 0402, may also be used depending on available space in the output capacitor substrate layer 453 and the particular capacitance value of the output capacitor 124. The embedded capacitors 463 may be placed in one or more cavities or other carved out regions within the output capacitor substrate layer 453. In one embodiment, the embedded capacitors 463 are the only discrete components embedded within the output capacitor substrate layer 453. FIG. 6 shows the embedded capacitors 463 of the output capacitors 124-1, 124-3, and 124-5 in cavities embedded within the output capacitor substrate layer 453.

Figure 7:
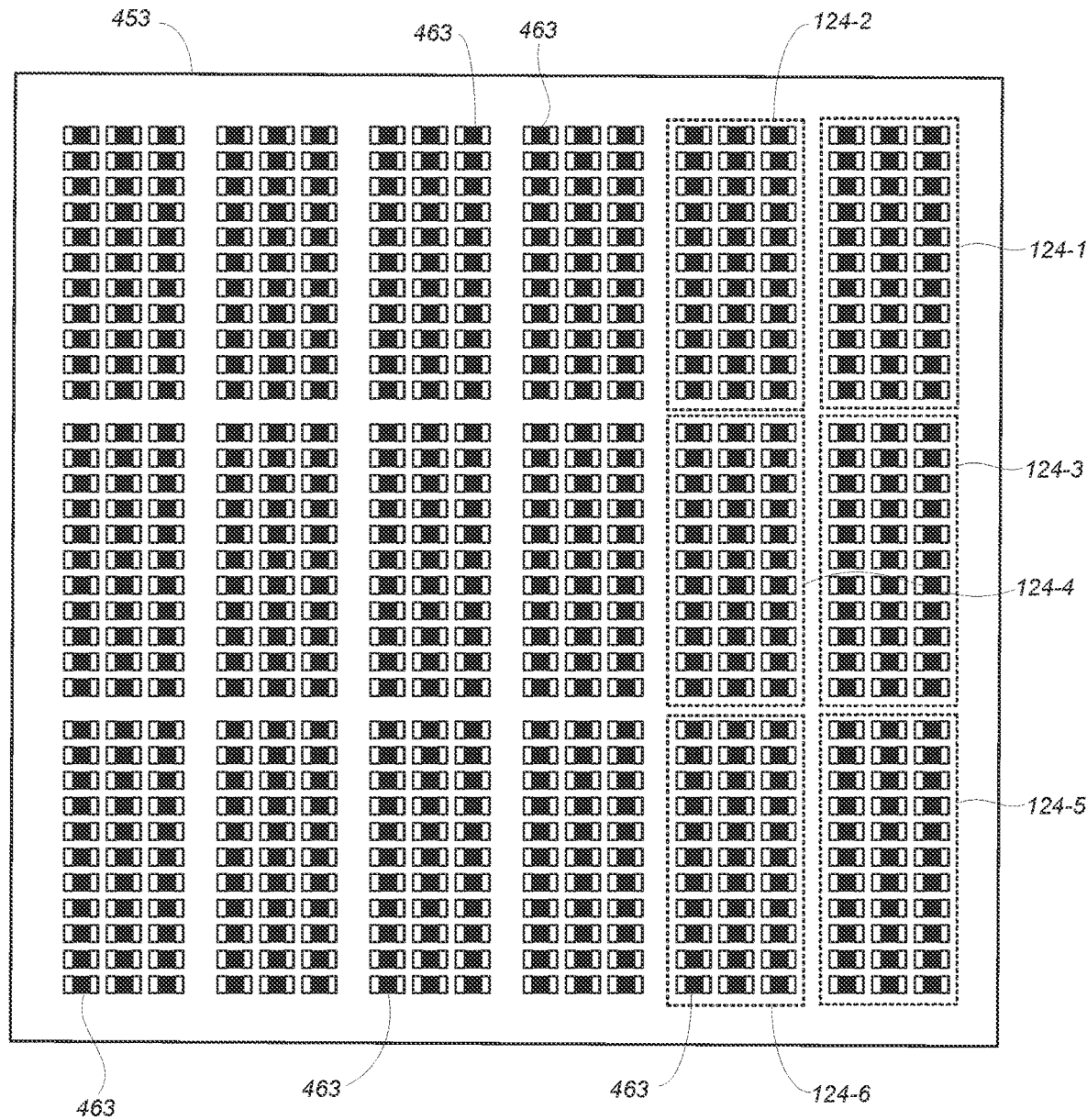
FIG. 7 shows a top surface of an output capacitor substrate layer in accordance with an embodiment of the present invention.

FIG. 7 shows the top view of the output capacitor substrate layer 453 in accordance with an embodiment of the present invention. In the example of FIG. 7, the embedded capacitors 463 are physically arranged in blocks of 33 discrete capacitors, with each block forming an output capacitor 124. The blocks of embedded capacitors 463 are arranged as a 6×3 array. FIG. 7 shows the embedded capacitors 463 that form the output capacitors 124-1, 124-2, 124-3, etc. Only some of the embedded capacitors 463 forming the output capacitors 124 are labeled for clarity of illustration.

Low-profile power modules have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A power module comprising:
   a printed circuit board (PCB) comprising an output capacitor substrate layer and an output inductor substrate layer;
   a first monolithic integrated circuit (IC) switch block mounted on a top surface of the output inductor substrate layer, the first monolithic IC switch block including a first pair of switches, the top surface of the output inductor substrate layer being a topmost surface of the PCB;
   a second monolithic IC switch block mounted on the top surface of the output inductor substrate layer, the second monolithic IC switch block including a second pair of switches;
   a first output inductor that is embedded within the output inductor substrate layer, the first output inductor having a first end that is connected to a switch node formed by the first pair of switches and a second end that is connected to a first output voltage node;
   a second output inductor that is embedded within the output inductor substrate layer, the second output inductor having a first end that is connected to a switch node formed by the second pair of switches and a second end that is connected to a second output voltage node;
   a first output capacitor that is embedded within the output capacitor substrate layer, the first output capacitor having a first end that is connected to the first output voltage node and a second end that is connected to ground; and
   a second output capacitor that is embedded within the output capacitor substrate layer, the second output capacitor having a first end that is connected to the second output voltage node and a second end that is connected to ground.

2. The power module of claim 1, wherein the PCB further comprises an interposer substrate layer.

3. The power module of claim 2, wherein the first output voltage node and the second output voltage node are connected to corresponding pins on a bottom surface of the interposer substrate layer, wherein the bottom surface of the interposer substrate layer is a bottommost surface of the PCB.

4. The power module of claim 2, wherein the output capacitor substrate layer is disposed between the output inductor substrate layer and the interposer substrate layer.

5. The power module of claim 4, wherein a top surface of the output capacitor substrate layer contacts a bottom surface of the output inductor substrate layer and a bottom surface of the output capacitor substrate layer contacts a top surface of the interposer substrate layer.

6. The power module of claim 1, wherein the first output capacitor and the second output capacitor each comprises a plurality of discrete capacitors that are connected in parallel.

7. The power module of claim 6, wherein each of the first output capacitor and the second output capacitor is disposed in a cavity within the output capacitor substrate layer.

8. A power module comprising:
a printed circuit board (PCB) comprising an output capacitor substrate layer and an output inductor substrate layer;
a first power converter that generates a first output voltage at a first output voltage node, one or more components of the first power converter being mounted on a topmost surface of the PCB;
a first output inductor that is embedded within the output inductor substrate layer, the first output inductor being connected to the first output voltage node;
a first output capacitor that is embedded within the output capacitor substrate layer, the first output capacitor having a first end that is connected to the first output voltage node and a second end that is connected to ground,
a second power converter that generates a second output voltage at a second output voltage node, one or more components of the second power converter being mounted on the topmost surface of the PCB;
a second output inductor that is embedded within the output inductor substrate layer, the second output inductor being connected to the second output voltage node; and
a second output capacitor that is embedded within the output capacitor substrate layer, the second output capacitor having a first end that is connected to the second output voltage node and a second end that is connected to ground.

9. The power module of claim 8, wherein each of the first and second output capacitors comprises a plurality of discrete capacitors that are connected in parallel.

10. The power module of claim 9, wherein each of the first and second output capacitors is disposed in a cavity within the output capacitor substrate layer.

11. The power module of claim 9, wherein the PCB further comprises an interposer substrate layer.

12. The power module of claim 11, wherein the output capacitor substrate layer is disposed between the output inductor substrate layer and the interposer substrate layer.

13. The power module of claim 12, wherein the each of the first output voltage node and the second output voltage node is connected to a corresponding pin that is disposed on a bottom surface of the interposer substrate layer, and the bottom surface of the interposer substrate layer is a bottommost surface of the PCB.

14. A power module comprising:
a printed circuit board (PCB) comprising an output capacitor substrate layer and an output inductor substrate layer;
a first monolithic integrated circuit (IC) switch block mounted on a top surface of the output inductor substrate layer, the first monolithic IC switch block comprising a switch that is connected to a first output voltage node;
a second monolithic IC switch block mounted on the top surface of the output inductor substrate layer, the second monolithic IC switch block comprising a switch that is connected to a second output voltage node;
a first output inductor that is embedded within the output inductor substrate layer, the switch of the first monolithic IC switch block being connected to the first output voltage node by way of the first output inductor;
a second output inductor that is embedded within the output inductor substrate layer, the switch of the second monolithic IC switch block being connected to the second output voltage node by way of the second output inductor;
a first plurality of discrete capacitors that are connected in parallel, the first plurality of discrete capacitors being embedded within the output capacitor substrate layer, the first plurality of discrete capacitors being connected between the first output voltage node and ground; and
a second plurality of discrete capacitors that are connected in parallel, the second plurality of discrete capacitors being embedded within the output capacitor substrate layer, the second plurality of discrete capacitors being connected between the second output voltage node and ground.

15. The power module of claim 14, wherein the PCB further comprises an interposer substrate layer.

16. The power module of claim 15, wherein the output capacitor substrate layer is disposed between the output inductor substrate layer and the interposer substrate layer.

17. The power module of claim 16, wherein the first and second output voltage nodes are connected to corresponding pins on a bottom surface of the interposer substrate layer, and the bottom surface of the interposer substrate layer is a bottommost surface of the PCB.

18. The power module of claim 14, wherein the switch of the first monolithic IC switch block forms a first switch node with another switch of the first monolithic IC switch block, the first output inductor is connected between the first switch node and the first output voltage node, the switch of the second monolithic IC switch block forms a second switch node with another switch of the second monolithic IC switch block, and the second output inductor is connected between the second switch node and the second output voltage node.

* * * * *